United States Patent
He et al.

(10) Patent No.: US 8,450,605 B2
(45) Date of Patent: *May 28, 2013

(54) PHOTOELECTRIC CONVERSION DEVICE AND METHOD FOR MAKING THE SAME

(75) Inventors: Xiang-Ming He, Beijing (CN); Li Wang, Beijing (CN); Wei-Hua Pu, Beijing (CN); Wen-Ting Sun, Beijing (CN); Jian-Jun Li, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 83 days.

This patent is subject to a terminal disclaimer.

(21) Appl. No.: 13/051,148

(22) Filed: Mar. 18, 2011

(65) Prior Publication Data

US 2012/0097235 A1 Apr. 26, 2012

(30) Foreign Application Priority Data

Oct. 20, 2010 (CN) .......................... 2010 1 0512912

(51) Int. Cl.
*C08F 6/06* (2006.01)
*C08F 20/44* (2006.01)
*H01L 51/44* (2006.01)
*H01L 51/46* (2006.01)
*H01L 51/48* (2006.01)

(52) U.S. Cl.
USPC ............. 136/263; 525/329.1; 525/329.2; 423/447.7; 423/447.8; 523/322; 524/84; 524/173; 524/235; 524/259; 524/565; 136/256; 438/82; 257/E51.027; 977/734

(58) Field of Classification Search
USPC ............. 136/263; 438/82; 525/329.1, 329.2; 423/447.7, 447.8; 523/322; 524/84, 173, 524/235, 259, 565
See application file for complete search history.

(56) References Cited

U.S. PATENT DOCUMENTS

| 3,647,770 A * | 3/1972 | Gump et al. ................. 525/354 |
| 2004/0070107 A1* | 4/2004 | Stoy ............................ 264/232 |
| 2010/0006154 A1* | 1/2010 | Kitazawa et al. ............. 136/263 |

FOREIGN PATENT DOCUMENTS

WO WO2008044585 * 4/2008 ............... 136/263

OTHER PUBLICATIONS

Chung, Deborah, Carbon Fiber Composites, 1994, Elsevier, pp. 13-53.*
Metz et al, Evaluation of Polyacrylonitrile as a Potential Organic Polymer Photovoltaic Material, 1983, Brookhaven National Laboratory, pp. 26-41.*
"Fabrication of Li-ion battery with sulfurized polyacrylonitrile", Ren et al. pp. 73-74, vol. 38, No. 2, 2008.
"The structure property and application of conductive material of pyrolytic polyacrylonitrile", Yao et al. pp. 39-43, vol. 33, No. 1, 2001.

* cited by examiner

*Primary Examiner* — Jonathan Johnson
*Assistant Examiner* — Bethany Lambright
(74) *Attorney, Agent, or Firm* — Altis Law Group, Inc.

(57) ABSTRACT

The present disclosure relates to a method for making a conjugated polymer. In the method, polyacrylonitrile, a solvent, and a catalyst are provided. The polyacrylonitrile is dissolved in the solvent to form a polyacrylonitrile solution. The catalyst is uniformly dispersed into the polyacrylonitrile solution. The polyacrylonitrile solution with the catalyst is heated to induce a cyclizing reaction of the polyacrylonitrile, thereby forming a conjugated polymer solution with the conjugated polymer dissolved therein.

13 Claims, 12 Drawing Sheets

PHOTOELECTRIC CONVERSION DEVICE AND METHOD FOR MAKING THE SAME

CROSS-REFERENCE TO RELATED APPLICATIONS

This application claims all benefits accruing under 35 U.S.C. §119 from China Patent Application No. 201010512912.9, filed on Oct. 20, 2010, in the China Intellectual Property Office, the disclosure of which is incorporated herein by reference. This application is related to commonly-assigned applications entitled, "METHOD FOR MAKING SULFURIZED POLYACRYLONITRILE," filed Mar. 18, 2011 Ser. No.13/051117; "SULFURIZED POLYACRYLONITRILE AND LITHIUM-ION BATTERY CATHODE MATERIAL USING THE SAME," filed Mar. 18, 2011 Ser. No.13/051131; "METHOD FOR MAKING CONJUGATED POLYMER," filed Mar. 18, 2011 Ser. No.13/051123.

BACKGROUND

1. Technical Field

The present disclosure relates to photoelectric conversion devices and methods for making the same, and particularly, to a photoelectric conversion device using a conjugated polymer as an electron donor layer and a method for making the same.

2. Description of Related Art

A conjugated polymer is a polymer having a π bond conjugated system. The conjugated polymer may have a good optical property and semi-conductivity because electrons of the π bonds conjugated system are highly delocalized. Thus, the conjugated polymer has interesting and potential application in a plurality of fields. For example, the soluble conjugated polymer can be used as an electron donor layer commonly fabricated by processing the soluble conjugated polymer into a film shape. The soluble conjugated polymer can be alkoxyl substituted poly p-phenylenevinylene derivatives or alkyl group substituted polythiophene derivatives.

Polyacrylonitrile (PAN) is a high polymer composed of saturated carbon skeleton containing cyano groups (C≡N) on alternate carbon atoms. PAN itself is not conductive but can be pyrolyzed by directly heating to form conjugated polymer. The conjugated polymer has a high conductivity, charge storage property, and charge/discharge efficiency. Thus, the conjugated polymer formed by directly heating the PAN can serve as a cathode active material of the lithium-ion battery.

However, the conjugated polymer formed by directly heating the PAN has a black powder shape, and is insoluble in most solvents. Thus, the application of the conjugated polymer is limited because of the insolubility, and the conjugated polymer is difficult to be processed into a film in the photoelectric conversion device.

What is needed, therefore, is to provide a photoelectric conversion device using the conjugated polymer formed by PAN.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
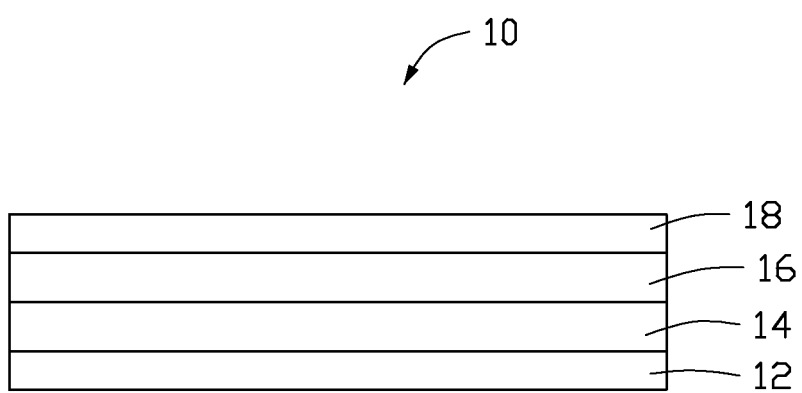
FIG. 1 is a structural schematic view of one embodiment of a photoelectric conversion device.

Referring to FIG. 1, a photoelectric conversion device 10 includes a positive electrode layer 12, an electron donor layer 14, an electron acceptor layer 16, and a negative electrode layer 18. The positive electrode layer 12, the electron donor layer 14, the electron acceptor layer 16, and the negative electrode layer 18 are stacked in series with each other. The electrode donor layer 14 is made of a conjugated polymer layer composed of cyclized polyacrylonitrile.

The positive electron layer 12 can be a transparent conductive layer or an opaque conductive layer. A light transmission rate of the transparent conductive layer can be larger than 60%. A material of the transparent conductive layer can be indium tin oxide (ITO) layer, indium zinc oxide (IZO) layer, or carbon nanotube film. A material of the opaque conductive layer can be metal or other conductive material. If the positive electron layer 12 is the transparent conductive layer, the shape of the transparent conductive layer can be square, circular, oval, or other regular or irregular pattern shape (e.g. lattice shape). If the positive electrode layer 12 is the opaque conductive layer, the shape of the opaque conductive layer can be a pattern shape to avoid obstructing light transmission to the electron donor layer 14, for example, a lattice shape or other regular or irregular pattern shape. A thickness of the positive electrode layer 12 is not limited and can be in a range from about 10 nanometers (nm) to about 50 micrometers (μm). In one embodiment, the thickness of the positive electrode layer 12 is in a range from about 10 nm to about 50 nm. For example, the positive electrode layer 12 is a square shaped ITO layer having the thickness of about 30 nm.

The conjugated polymer layer is a continuous integral structure composed of the cyclized PAN. The cyclized PAN is a continuous macromolecular structure, not in particle forms. The conjugated polymer layer can further include a plurality of photoelectric catalyst particles located in the continuous cyclized PAN. A diameter of the photoelectric catalyst particle can be in a range from about 1 nm to about 10 μm. A mass percent of the photoelectric catalyst particles can be in a range from about 1% to about 90% in the conjugated polymer layer. In one embodiment, the diameter of the photoelectric catalyst particles is in a range from about 20 nm to about 50 nm, the mass percent of the photoelectric catalyst particles is in a range from about 20% to about 50% in the conjugated polymer layer. For example, the photoelectric catalyst particles are titanium dioxide particles having a diameter of about 50 nm and a mass percent of about 30% in the conjugated polymer layer. The photoelectric catalyst particles can improve a photoelectric conversion efficiency of the photoelectric conversion device. The cyclized PAN is the PAN being induced in a cyclization reaction to form conjugated C=N double bonds or C=C double bonds. The cyclized PAN can be soluble to an organic solvent. The organic solvent can be dimethyl formamide (DMF), dimethylacetamide (DMA), dimethyl sulfoxide (DMSO), malononitrile, sulfolane, or ethyl nitrite. The cyclized PAN can absorb light (e.g. ultraviolet light or visible light), and generate electrons after absorbing light. A thickness of the electron donor layer 14 can be in a range from about 1 nm to about 100 nm. In one embodiment, the thickness of the electron donor layer 14 is in a range from about 10 nm to about 50 nm (e.g. 50 nm). The electron donor layer 14 is different from a layer formed by flatly laying particle shaped or powder shaped material, and is a conjugated polymer layer having a continuous integral structure.

The electron acceptor layer 16 can be fullerene, fullerene derivatives, poly(phenylene vinylene) derivatives, triazole derivatives, or organosilane derivatives. The fullerene can be $C_{60}$, $C_{70}$, $C_{82}$, or $C_{84}$. The fullerene derivatives are compounds formed by bonding a substitution group to carbon atoms of the fullerene. A thickness of the electron acceptor layer 16 can be in a range from about 1 nm to about 100 nm. In one embodiment, the thickness of the electron acceptor layer 16 is in a range from about 10 nm to about 50 nm.

A material of the negative electrode layer 18 is not limited, and can be transparent or opaque material. The material of the negative electrode layer 18, such as aluminum, calcium, and lithium, has a low work function to accept electrons. A shape of the negative electrode layer 18 is not limited and can be square, circular, oval, or other regular or irregular pattern shape. A thickness of the negative electrode layer 18 can be in a range from about 10 nm to about 5 μm. In one embodiment, the thickness of the negative electrode layer 18 is in a range from about 10 nm to about 100 nm. For example, the negative electrode layer 18 is a square shaped aluminum layer having a thickness of about 50 nm.

In use, light irradiates to the electron donor layer 14 through the positive electrode layer 12, and the electron donor layer 14 absorbs a portion of the incident light to generate electron hole pairs. Thus, the light energy is transformed into electrical energy, and a barrier electrical field is formed between the electron donor layer 14 and the electron acceptor layer 16. Accordingly, the electrons are trended toward the electron acceptor layer 16 to generate superfluous electrons in the electron acceptor layer 16, and the holes are trended toward the electron donor layer 14 to generate superfluous holes in the electron donor layer 14. In addition, a light electrical field having an electrical field direction opposite to the field direction of the barrier electrical field, is formed between the electron donor layer 14 and the electron acceptor layer 16. The light electrical field can counteract the barrier electrical field. Under the action of the light electrical field, the electron donor layer 14 can carry positive charges, the electron acceptor layer 16 can carry negative charges, and a photovoltaic electrodynamic force can be produced in a thin layer between the electron donor layer 14 and the electron acceptor layer 16. Furthermore, metal lead wires can be welded to the positive electrode layer 12 and the negative electrode layer 18 to connect the photoelectric conversion device to a load.

Figure 2:
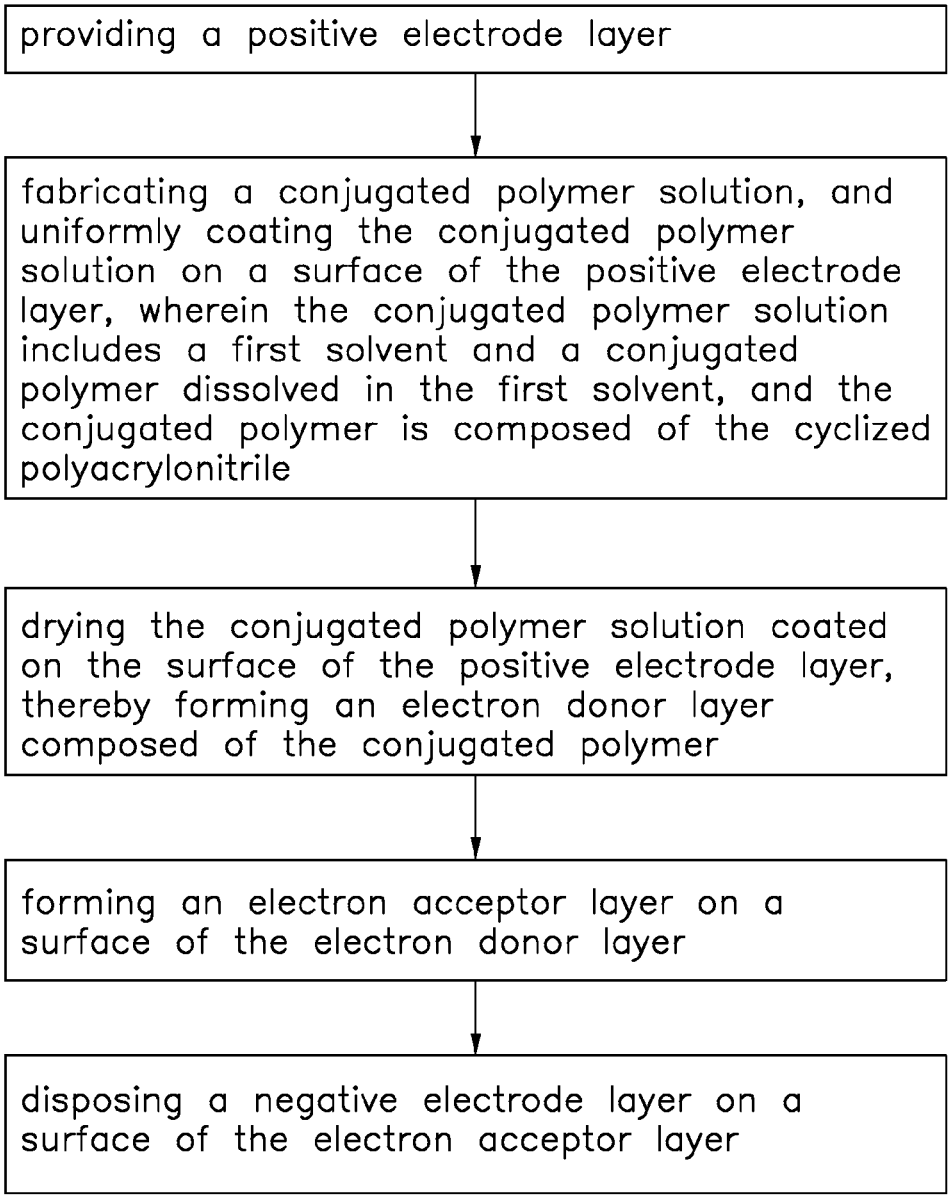
FIG. 2 is a flow chart of one embodiment of a method for making the photoelectric conversion device of FIG. 1.

Referring to FIG. 2, a method for making the photoelectric conversion device includes the following steps:

M1, providing a positive electrode layer;

M2, fabricating a conjugated polymer solution, and uniformly coating the conjugated polymer solution on a surface of the positive electrode layer, wherein the conjugated polymer solution includes a first solvent and a conjugated polymer dissolved in the first solvent, and the conjugated polymer is composed of the cyclized PAN;

M3, drying the conjugated polymer solution coated on the surface of the positive electrode layer, thereby forming an electron donor layer composed of the conjugated polymer;

M4, forming an electron acceptor layer on a surface of the electron donor layer; and M5, disposing a negative electrode layer on a surface of the electron acceptor layer.

In step M2, one embodiment of a method for making the conjugated polymer solution includes the following substeps:

S1, providing PAN, a first solvent, and a catalyst;

S2, dissolving the PAN in the first solvent to form a PAN solution, and uniformly dispersing the catalyst in the PAN solution; and S3, heating the catalyst dispersed PAN solution to induce a PAN cyclizing reaction, thereby forming a conjugated polymer solution having a conjugated polymer dissolved therein, wherein the conjugated polymer is composed of cyclized PAN.

In step S1, the first solvent can completely dissolve the PAN. The first solvent can be a polar organic solvent. The polar organic solvent can be dimethyl formamide (DMF), dimethylacetamide (DMAC), dimethyl sulfoxide (DMSO), malononitrile, sulfolane, or ethyl nitrite. A molecular weight of PAN is not limited. In one embodiment, the molecular weight of PAN is in a range from about 1000 to about 100000. The catalyst can be metal powder, metal oxide powder, metal salt powder, sulfur powder, or any combination thereof. Metal elements in the metal powder, metal oxide powder, and metal salt can be transition elements, group IVA elements, group VA elements, or any combination thereof. The catalyst can be either soluble or insoluble to the PAN solution. The metal powder can be silver powder, copper powder, tin powder, iron powder, cobalt powder, or nickel powder. The metal oxide powder can be titanium oxide powder, copper oxide powder, or iron oxide powder. The metal salt can be cobalt salt, tin salt, copper salt, nickel salt, or zinc salt, for example, cobalt nitrate ($Co(NO_3)_2$), zinc chloride ($ZnCl_2$), or antimony chloride ($SbCl_3$). If the catalyst is insoluble to the PAN solution, the smaller the diameter of the catalyst particles, the easier the catalyst particles are dispersed into the PAN solution, the faster the cyclizing of the PAN, and the faster the conjugated polymer is formed in the step S3. The diameter of the catalyst particles can be in a range from about 50 nanometers (nm) to about 500 micrometers (μm). In one embodiment, the diameter of the catalyst particles is in a range from about 100 nm to about 100 μm. In addition, the more catalyst that is dispersed, the faster the cyclizing of the PAN. A mass ratio of the catalyst to the PAN can be in a range from about 1:0.2 to about 1:6. In one embodiment, the mass ratio of the catalyst to the PAN is in a range from about 1:2 to about 1:4.

In the step S2, a mass concentration of the PAN solution is not limited. In one embodiment, the mass concentration of the PAN solution is in a range from about 0.1% to about 10%.

In step S3, the PAN solution with the catalyst therein can be heated in a water or oil bath. The heating temperature can be in a range from about 80 degrees Celsius to about 300 degrees Celsius to induce the cyclizing reaction of the PAN within a short period, thereby forming a soluble conjugated polymer dissolved in the first solvent. In addition, an insoluble conjugated polymer cannot be formed and cannot be precipitated from the first conjugated polymer solution in the heating temperature range. The heating period can be set to sufficiently form soluble conjugated polymer. The heating period can be in a range from about 5 minutes to about 20 days. Color changes of the PAN solution can be observed to determine if the conjugated polymer is formed or not. In one embodiment, when the PAN solution color becomes black, the conjugated polymer is formed. The darker the solution color, the higher the conjugated polymer cyclizing level. The conjugated polymer includes C=N double bonds and C=C double bonds.

In the heating process, the PAN solution with the catalyst therein can be further agitated to sufficiently mix the catalyst and the PAN in the first solvent, and speed up the formation of the conjugated polymer. The agitating method is not limited, and can be magnetic stirring, ultrasonic dispersion, or mechanical agitation. An agitating rate is not limited. If the mechanical agitation is used, the agitating speed can be in a range from about 100 rotations per minute (rpm) to about 1000 rpm.

The conjugated polymer solution is composed of the cyclized PAN formed by cyclizing the PAN, the catalyst, and the first solvent. The conjugated polymer is soluble in the first solvent. The catalyst can be soluble or insoluble in the first solvent. If the catalyst is not insoluble in the first solvent, the catalyst exists in the form of particles.

Furthermore, after forming the conjugated polymer solution, a step S4 can be provided to remove the catalyst and the first solvent.

In step S4, if the catalyst is insoluble in the first solvent, the catalyst can be filtered out of the first conjugated polymer solution using a filter gauze. The filter gauze defines a plurality of holes having diameter less than the diameter of the catalyst particles. If the catalyst is soluble in the first solvent, the catalyst can be separated out along with the first solvent. In one embodiment, a solvent filter can be used to separate out the first solvent and the catalyst from the conjugated polymer solution, thereby only leaving the pure conjugated polymer having a black powder shape. In another embodiment, the first conjugated polymer solution can be slowly heated below a low temperature (e.g. 80 degrees Celsius), thereby volatilizing the first solvent. After the first solvent is volatilized, a resonance filter or a centrifugal machine can separate the catalyst and the conjugated polymer from each other according to specific gravity difference or electromagnetic difference therebetween.

Furthermore, in step M2, the plurality of photoelectric catalyst particles is uniformly dispersed in the conjugated polymer solution before coating the conjugated polymer solution on the surface of the positive electrode layer. The photoelectric catalyst particle is titanium dioxide particle. A diameter of the photoelectric catalyst particle can be in a range from about 1 nm to about 10 μm. A mass percent of the photoelectric catalyst particles in the conjugated polymer solution can be in a range from about 1% to about 90%. In one embodiment, the photoelectric catalyst particle is titanium dioxide particle having a diameter of about 50 nm and a mass percent of about 30%. The photoelectric catalyst particles can improve a photoelectric conversion efficiency of the photoelectric conversion device. In addition, if the catalyst itself is the same as the photoelectric catalyst particles, the catalyst does not need to be removed by the step S4, and can substitute the photoelectric catalyst particles.

The conjugated polymer solution can be directly coated on the positive electrode layer 12. In addition, the conjugated polymer can be preserved after the first solvent and the catalyst removed. In use, the preserved conjugated polymer can be dissolved in the first solvent again to form the conjugated polymer solution, and the conjugated polymer solution can be coated on the positive electrode layer. The method for coating the conjugated polymer solution can be spin coating, immersion method, or spraying method. In one embodiment, the conjugated polymer solution is coated on the positive electrode layer using spin coating.

In step M3, the conjugated polymer solution can be dried by heating. A heating temperature can be in a range from about 80 Celsius degrees to about 100 Celsius degrees. The first solvent can be gradually volatilized in the heating process.

In step M4, a material of the electron acceptor layer can be fullerene or fullerene derivatives. The fullerene or fullerene derivatives can be formed on the electron donor layer using a vacuum vapor deposition method. In addition, the fullerene or fullerene derivatives can also be formed on the electron donor layer by the following steps:

B1, dispersing the fullerene or fullerene derivatives in a second solvent, thereby forming a second solution.

B2, coating the second solution on the electron donor layer, and removing the second solvent in the second solution.

In step B1, the second solvent can be chloroform, chlorobenzene, cyclohexane, or toluol. Furthermore, the second solution can be agitated using ultrasonic dispersing or magnetic stirring.

In step B2, the method for coating the second solution can be spin coating, immersion method, or spraying method.

In step M5, the negative electrode layer can be formed by vacuum evaporating or magnetron sputtering. A material of the negative electrode layer can be magnesium, aluminum, lithium, or alloy thereof.

The method for making the conjugated polymer is described by the following examples.

Example 1

In this example, the mass concentration of the PAN solution is about 5%. The catalyst is the silver powder has a particle diameter of about 100 μm. A ratio of the silver powder to the PAN is about 1:2.5. The silver powder dispersed PAN solution is heated at about 150 degrees Celsius by an oil bath, along with agitating the PAN solution at a rotating speed of about 500 rpm.

Specifically, the first solvent is DMF in the PAN solution. The PAN solution is heated for about 12 hours to cyclize the PAN until the PAN solution becomes black, thereby forming the conjugated polymer by the PAN cyclizing reaction.

Furthermore, the silver powder is separated out using the filter gauze, and the first solvent is separated out using the solvent filter, thereby forming the conjugated polymer.

Figure 3:
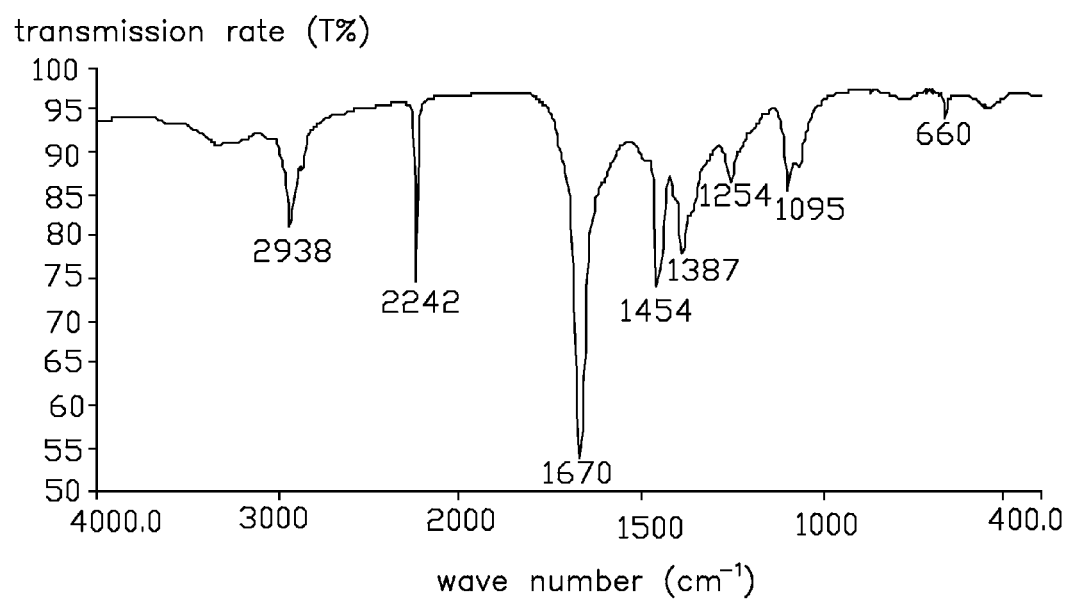
FIG. 3, FIG. 5, FIG. 7, FIG. 9, and FIG. 11 are Fourier Transform infrared spectroscopy (FTIR) spectrum test graphs of embodiments of the conjugated polymers.

Referring to FIG. 3, the achieved conjugated polymer of Example 1 is tested. Wherein the characteristic absorption peak at 2242 $cm^{-1}$ corresponds to the C=C bonds, the characteristic absorption peak at 2938 $cm^{-1}$ corresponds to $CH_2$ bonds, the characteristic absorption peak at 1387 $cm^{-1}$ corresponds to the CH bonds, and the characteristic absorption peak at 1670 $cm^{-1}$ corresponds to the C=N bonds or C=C bonds in the conjugated polymer. The characteristic absorption peak of C=N bonds or C=C bonds at 1670 $cm^{-1}$ indicating the PAN cyclizing reaction has occurred during the above method.

Figure 4:
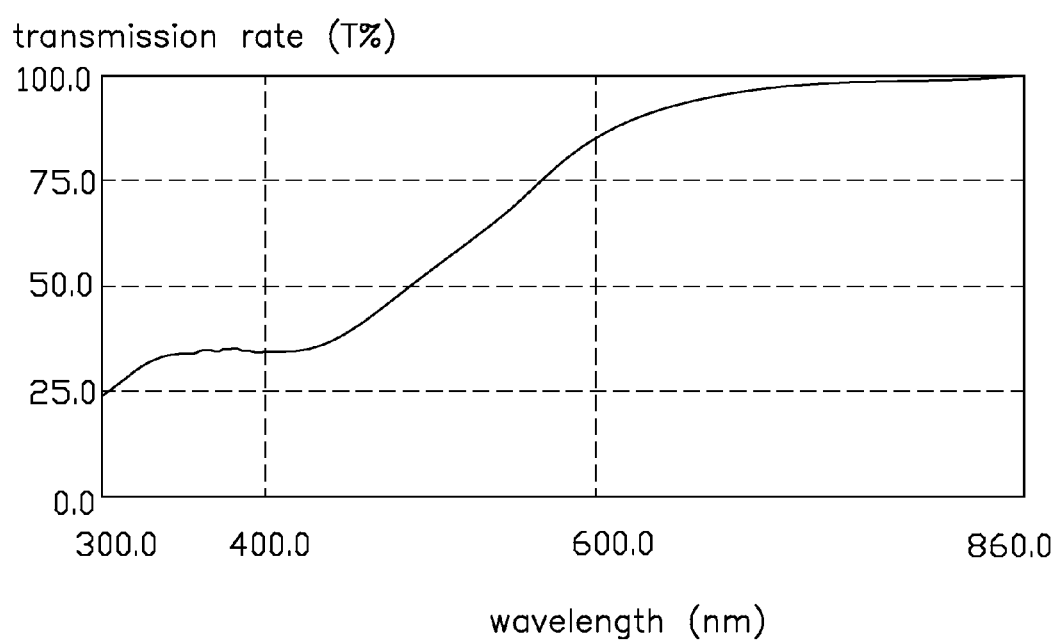
FIG. 4, FIG. 6, FIG. 8, FIG. 10, and FIG. 12 are ultraviolet-visible absorption spectrum test graphs of embodiments of the conjugated polymers.

In addition, the non-conjugated unsaturated polymer can absorb ultraviolet light having a relatively short wavelength. If a polymer has conjugated typed double bonds, the polymer can absorb ultraviolet light having a relatively long wavelength or visible light. The greater the conjugated typed double bonds, the more the polymer absorbs the intensity of the light having the long wavelength. Referring to FIG. 4, an ultraviolet-visible absorption spectrum test graph of the obtained conjugated polymer of Example 1 is measured. The conjugated polymer intensively absorbs ultraviolet light having a wavelength in a range from about 300 nm to about 400 nm, and weakly absorbs ultraviolet light having a wavelength in a range from about 400 nm to about 600 nm and visible light having a wavelength greater than 600 nm. Thus, the absorption of ultraviolet light and visible light having a long wavelength indicates that the conjugated typed double bonds exist in the conjugated polymer.

It is further proven that the soluble conjugated polymer has been formed in Example 1 by analyzing FIGS. 3 and 4.

Example 2

In this example, the mass concentration of the PAN solution is about 3%. The catalyst is the sulfur powder having a particle diameter of about 100 nm. A mass ratio of the sulfur powder to the PAN is about 1:0.5. The PAN solution with the sulfur powder dispersed therein is heated at about 150 degrees Celsius by an oil bath, along with agitating the PAN solution at a rotating speed of about 500 rpm.

Specifically, the first solvent is DMSO. The PAN solution is heated for about 24 hours to cyclize the PAN until the PAN solution becomes black, thereby forming the conjugated polymer by the PAN cyclizing reaction.

Furthermore, the sulfur powder is separated out using the filter gauze, and the first solvent is separated out using the solvent filter, thereby forming the conjugated polymer.

Figure 5:
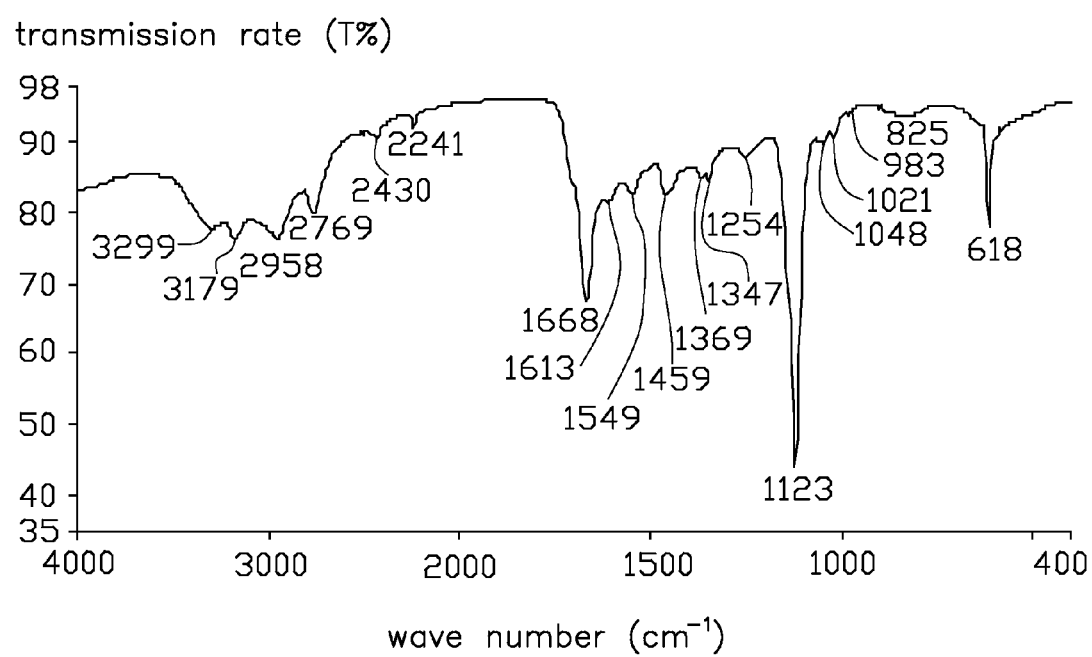

Referring to FIG. 5, the achieved conjugated polymer of the example 2 is tested, the characteristic absorption peak at about 1668 cm$^{-1}$ corresponds to the C=N bonds or C=C bonds. The characteristic absorption peak at about 1668 cm$^{-1}$ indicates a cyclizing reaction of the PAN is happened during the above method.

Figure 6:
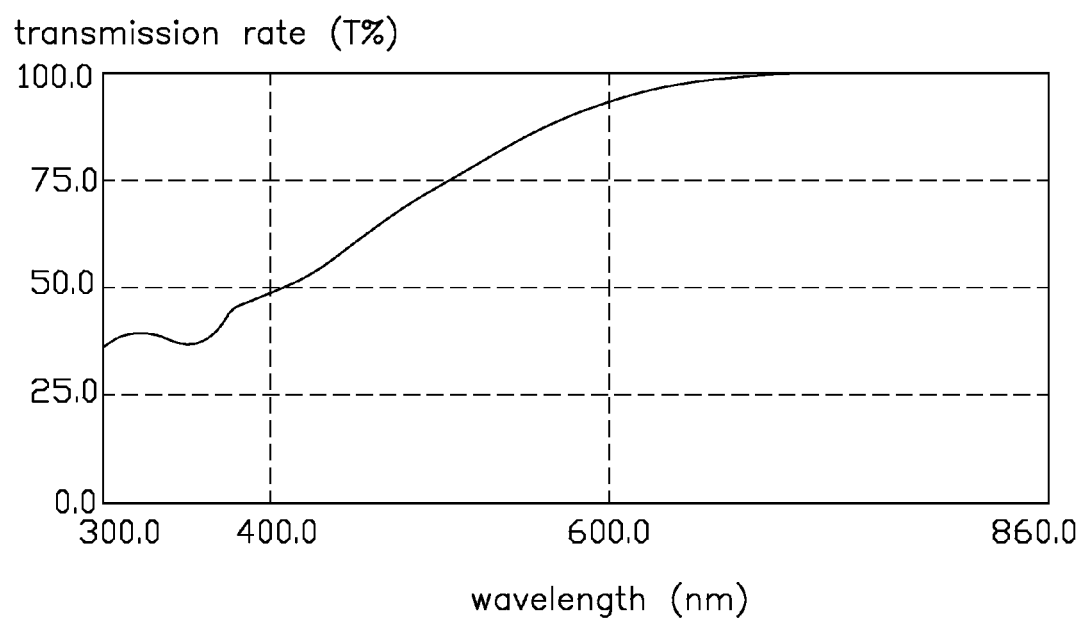

Referring to FIG. 6, the conjugated polymer of Example 2 weakly absorbs the ultraviolet light having a wavelength in a range from about 400 nm to about 600 nm and the visible light having a wavelength greater than 600 nm. Thus, the absorption of the ultraviolet light or visible light having a long wavelength indicates that the conjugated double bonds exist in the conjugated polymer.

It is further proven that the soluble conjugated polymer of Example 2 is formed by analyzing the FIGS. 5 and 6.

Example 3

In Example 3, the mass concentration of the PAN solution is about 1%. The catalyst is zinc chloride. A mass ratio of zinc chloride to the PAN is about 2.44:1. The PAN solution with the zinc chloride dispersed therein is heated at about 150 degrees Celsius by an oil bath, along with agitating the PAN solution at a rotating speed of about 500 rpm.

Specifically, the first solvent is DMF. The PAN solution is heated for about 24 hours to cyclize the PAN until the PAN solution becomes black, thereby forming the conjugated polymer by cyclizing reaction of PAN.

Furthermore, the zinc chloride and the first solvent are separated out using the solvent filter, thereby remaining the conjugated polymer.

Figure 7:
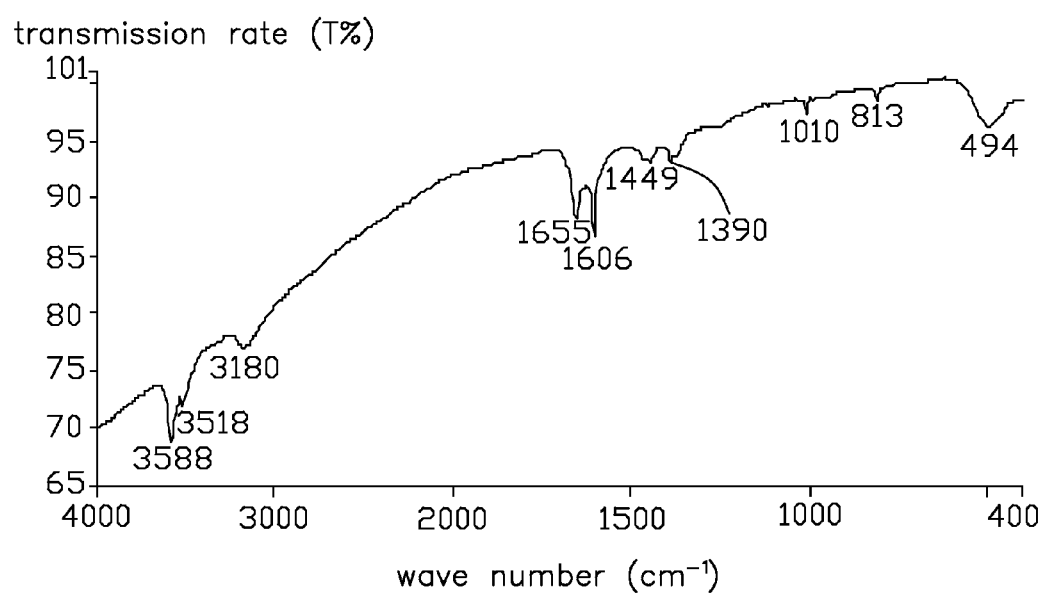

Referring to FIG. 7, the achieved conjugated polymer of Example 3 is tested. The characteristic absorption peak at about 1655 cm$^{-1}$ corresponds to the C=N bonds or C=C bonds. The characteristic absorption peak at about 1655 cm$^{-1}$ indicates the PAN cyclizing reaction has occurred during the above method.

Figure 8:
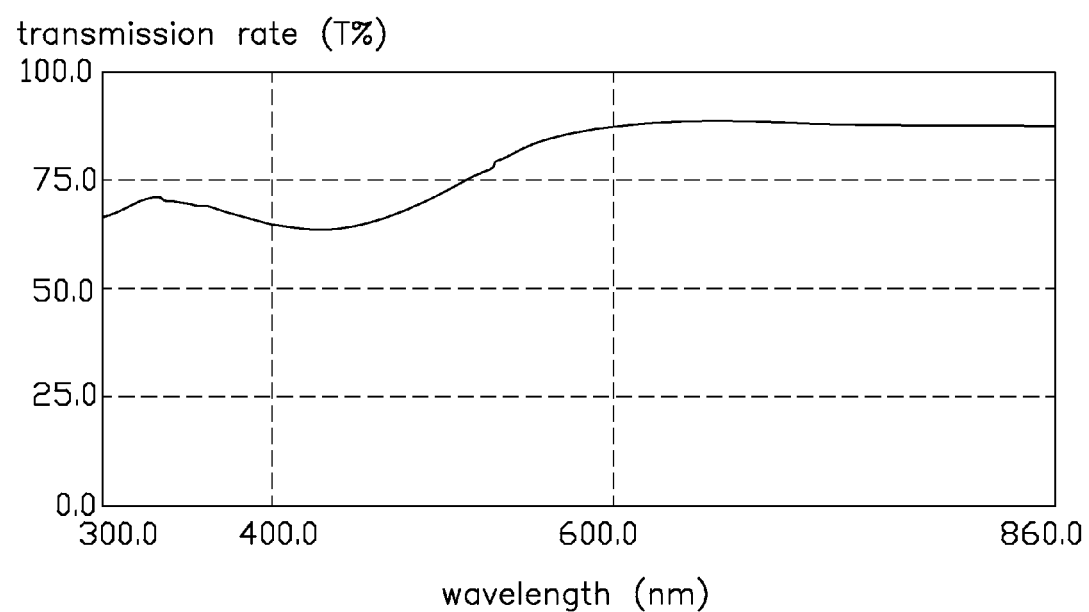

Referring to FIG. 8, the conjugated polymer of Example 3 uniformly absorbs the ultraviolet light having a wavelength in a range from about 400 nm to about 600 nm and the visible light having a wavelength in a range from about 600 nm to about 800 nm. Thus, the absorption of the ultraviolet light or visible light having a long wavelength indicates that the conjugated typed double bonds exist in the conjugated polymer, and the conjugated degree of the conjugated polymer is high.

It is proven that the soluble conjugated polymer has been formed by analyzing the FIGS. 7 and 8.

Example 4

In Example 4, the mass concentration of the PAN solution is about 6%. The catalyst is cobalt nitrate. A mass ratio of the cobalt nitrate to the PAN is about 27:5. The PAN solution with the cobalt nitrate dispersed therein is heated at about 150 degrees Celsius by an oil bath, along with agitating the PAN solution at a rotating speed of about 250 rpm.

Specifically, the first solvent is DMF in the PAN solution. The PAN solution is heated for about 48 hours to cyclize the PAN until the PAN solution becomes black, thereby forming the conjugated polymer by the PAN cyclizing reaction.

Furthermore, the cobalt nitrate and the first solvent are separated out using the solvent filter, thereby achieving the purified conjugated polymer.

Figure 9:
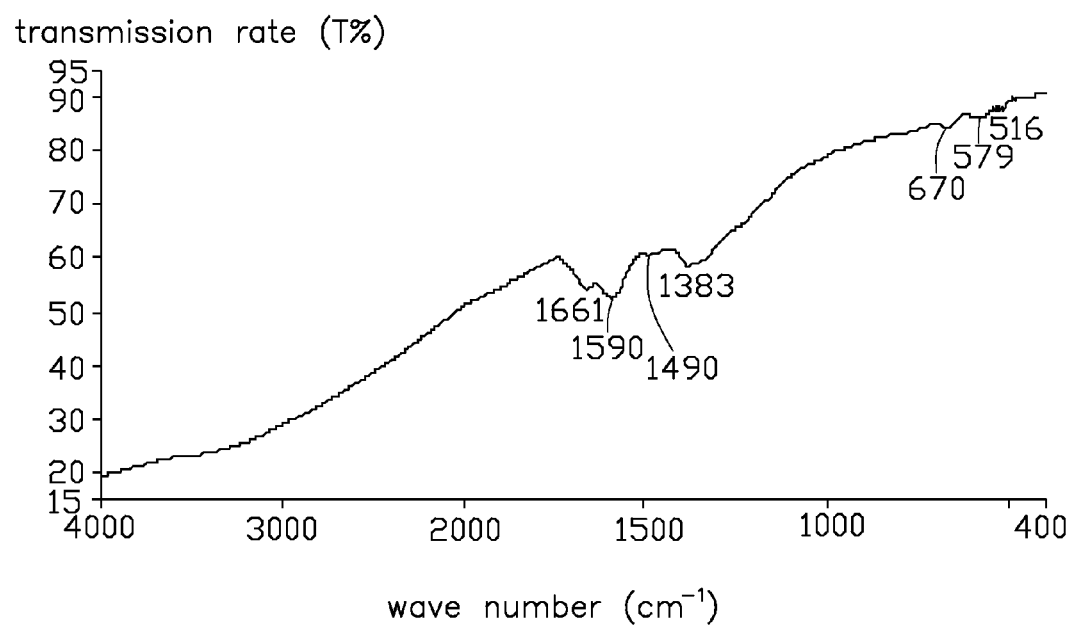

Referring to FIG. 9, the achieved conjugated polymer of Example 4 is tested. The characteristic absorption peak corresponding to C=C bonds completely disappears. A group of characteristic absorption peaks near 1661 cm$^{-1}$ corresponding to C=N bonds or C=C bonds appears. Thus, the conjugated polymer is completely cyclized.

Figure 10:
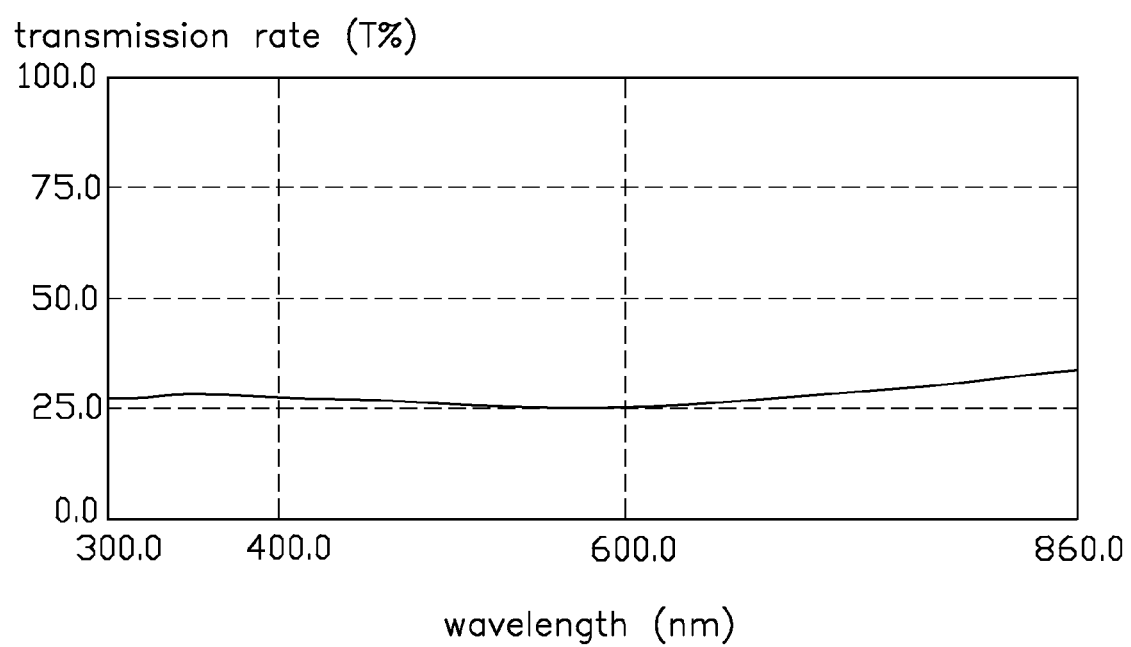

Referring to FIG. 10, the conjugated polymer of Example 4 uniformly absorbs the ultraviolet light having a wavelength in a range from about 400 nm to about 600 nm and the visible light having a wavelength in a range from about 600 nm to about 800 nm. The light absorbing ratio of the conjugated polymer is about 75%. Thus, the absorption of the ultraviolet light or visible light having a long wavelength indicates that the conjugated double bonds exist in the conjugated polymer, and the conjugated degree of the conjugated polymer is high.

It is proved the soluble conjugated typed polymer has been formed by analyzing the FIGS. 9 and 10.

Example 5

In an example 5, the mass concentration of the PAN solution is about 4%. The catalyst is titanium oxide powder. A mass ratio of the titanium oxide powder to the PAN is about 1:5. The titanium oxide powder dispersed PAN solution is heated at about 150 degrees Celsius by an oil bath, along with agitating the PAN solution at a rotating speed of about 500 rpm.

Specifically, the first solvent is DMF. The PAN solution is heated for about 16 days to cyclize the PAN until the PAN solution becomes black, thereby forming the conjugated polymer by the PAN cyclizing reaction.

Furthermore, the titanium oxide is separated out using the filter gauze, and the first solvent is separated out using the solvent filter, thereby achieving the purified conjugated polymer.

Figure 11:
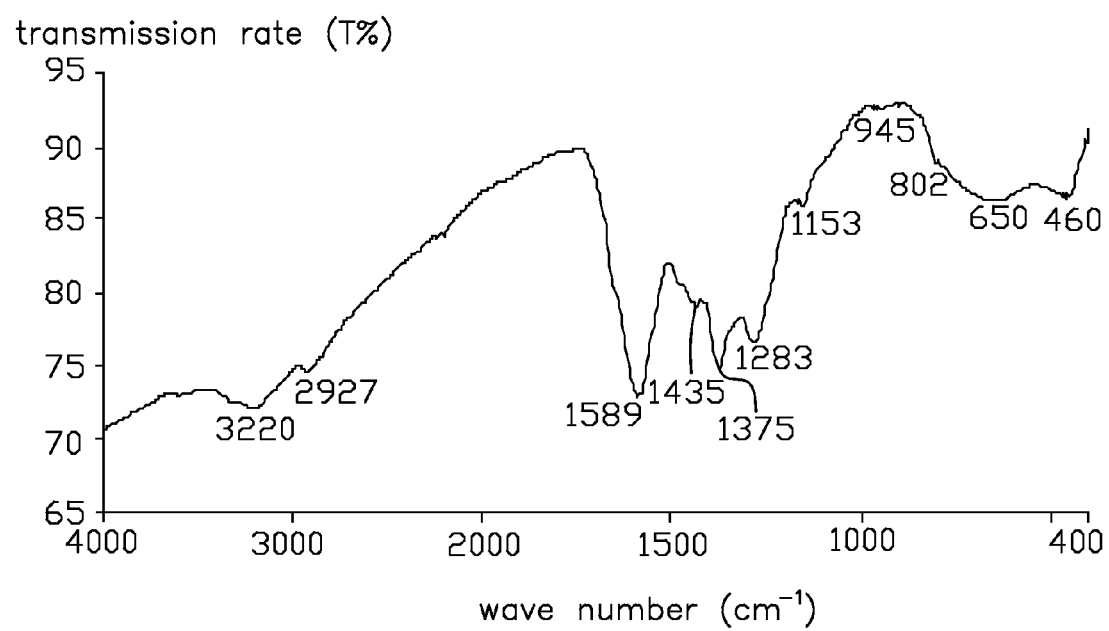

Referring to FIG. 11, the achieved conjugated polymer of Example 5 is tested. The characteristic absorption peak at about 1589 cm$^{-1}$ corresponds to C=N bonds or C=C bonds. The characteristic absorption peak at about 1589 cm$^{-1}$ indicates the PAN cyclizing reaction has occurred during the above method.

Figure 12:
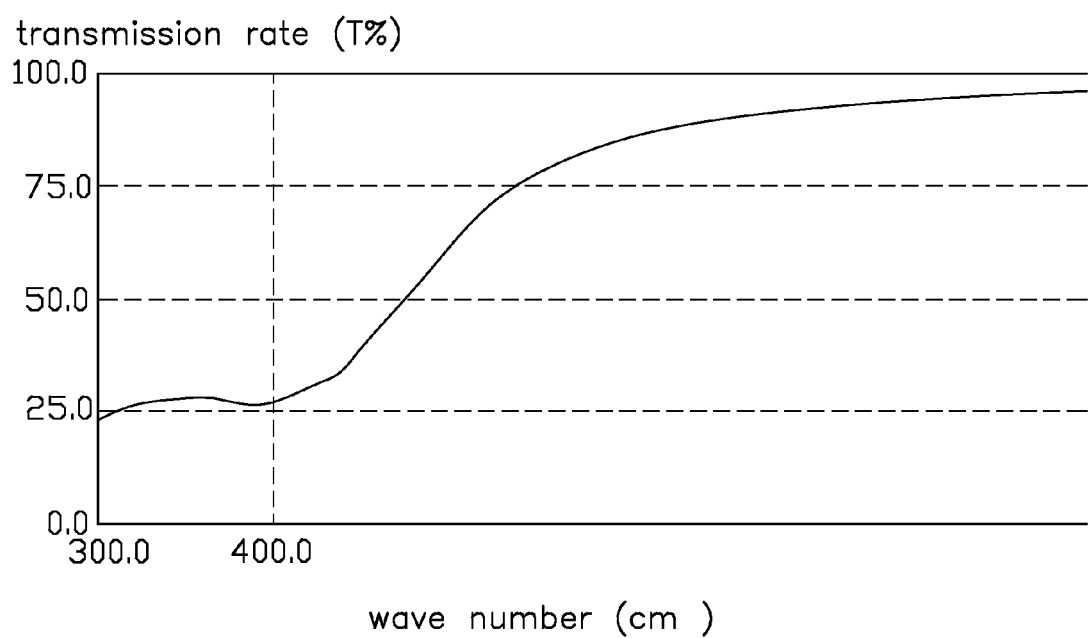

Referring to FIG. 12, the conjugated polymer in Example 5 uniformly absorbs the ultraviolet light having a wavelength in a range from about 400 nm to about 600 nm and the visible light having a wavelength in a range from about 600 nm to about 800 nm. Thus, the absorption of the ultraviolet light or visible light having a long wavelength indicates that the conjugated typed double bonds exist in the conjugated polymer, and the conjugated degree of the conjugated polymer is high.

It is proven the soluble conjugated polymer is formed by analyzing the FIGS. 11 and 12.

The conjugated polymer can absorb the ultraviolet light and the visible light, and has the conjugated C=C bonds or C=N bonds. Thus, the conjugated polymer has a good electrical conductivity and ionic conductivity, and can be used in a lithium-ion battery. Thus, the conjugated polymer can be used as the electrons donor layer of the photoelectric conversion device. In use, the conjugated polymer can be soluble to some solvents to conveniently process into a film, thereby increasing the number of applications.

Depending on the embodiment, certain steps of the methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A method for making a photoelectric conversion device, the method comprising:
    providing a positive electrode layer and a conjugated polymer solution, wherein the conjugated polymer solution comprises a first solvent and a conjugated polymer dissolved in the first solvent, and the conjugated polymer comprises cyclized polyacrylonitrile;
    uniformly coating the conjugated polymer solution on a surface of the positive electrode layer;
    drying the conjugated polymer solution coated on the surface of the positive electrode layer, thereby forming an electron donor layer;
    forming an electron acceptor layer on a surface of the electron donor layer; and
    disposing a negative electrode layer on a surface of the electron acceptor layer;
    wherein the conjugated polymer is made by the following steps:
        providing polyacrylonitrile, the first solvent, and a catalyst;
        dissolving the polyacrylonitrile in the first solvent to form a polyacrylonitrile solution at room temperature;
        uniformly dispersing the catalyst into the polyacrylonitrile solution, wherein the catalyst is metal powder or metal oxide powder; and
        heating the polyacrylonitrile solution with the dispersed catalyst to induce a cyclizing reaction of the polyacrylonitrile, thereby forming the conjugated polymer solution having the conjugated polymer dissolved therein, the catalyst is capable of promoting the cyclizing reaction.

2. The method as claimed in claim 1, wherein the electron acceptor layer is made by the following steps:
    dispersing fullerene or fullerene derivatives in a second solvent to form a second solution;
    uniformly coating the second solution on the electron donor layer; and
    removing the second solvent from the second solution.

3. The method as claimed in claim 2, wherein the second solvent is selected from the group consisting of chloroform, chlorobenzene, cyclohexane, toluol, and any combination thereof.

4. The method as claimed in claim 1, wherein the first solvent is a polar organic solvent selected from the group consisting of dimethyl formamide, dimethylacetamide, dimethyl sulfoxide, malononitrile, sulfolane, ethyl nitrite, and any combination thereof.

5. The method as claimed in claim 1, wherein a mass concentration of the polyacrylonitrile solution is in a range from about 0.1% to about 10%.

6. The method as claimed in claim 1, wherein a mass ratio of the catalyst to the polyacrylonitrile is in a range from about 1:0.2 to about 1:6.

7. The method as claimed in claim 1, wherein the metal powder is selected from the group consisting of silver powder, copper powder, stannum powder, iron powder, cobalt powder, nickel powder, and any combination thereof.

8. The method as claimed in claim 1, wherein the metal oxide powder is selected from the group consisting of titanium oxide powder, copper oxide powder, iron oxide powder, and any combination thereof.

9. The method as claimed in claim 1, wherein a heating temperature is in a range from about 80 degrees Celsius to about 300 degrees Celsius, and a heating period is in a range from about 5 minutes to about 20 days.

10. The method as claimed in claim 1, further comprising removing the catalyst after forming the conjugated polymer solution.

11. A method for making a photoelectric conversion device, the method comprising:
    providing a positive electrode layer;
    forming a conjugated polymer solution;
    uniformly coating the conjugated polymer solution on a surface of the positive electrode layer;
    drying the conjugated polymer solution coated on the surface of the positive electrode layer, thereby forming an electron donor layer;
    forming an electron acceptor layer on a surface of the electron donor layer; and
    disposing a negative electrode layer on a surface of the electron acceptor layer;
    wherein the conjugated polymer solution is formed by the following steps:
        providing polyacrylonitrile, a first solvent, and a catalyst;
        dissolving the polyacrylonitrile in the first solvent to form a polyacrylonitrile solution at room temperature;
        uniformly dispersing the catalyst into the polyacrylonitrile solution, wherein the catalyst is metal powder or metal oxide powder, a mass ratio of the catalyst to the polyacrylonitrile is in a range from about 1:0.2 to about 1:6; and
        heating the polyacrylonitrile solution with the dispersed catalyst to induce a cyclizing reaction of the polyacrylonitrile, thereby forming the conjugated polymer dissolved in the first solvent, wherein the conjugated polymer comprises cyclized polyacrylonitrile, and the catalyst is capable of promoting the cyclizing reaction.

12. The method as claimed in claim 11, wherein the metal powder is selected from the group consisting of silver powder, copper powder, stannum powder, iron powder, cobalt powder, and nickel powder.

13. The method as claimed in claim 11, wherein the metal oxide powder is selected from the group consisting of titanium oxide powder, copper oxide powder, and iron oxide powder.

\* \* \* \* \*